A.C. AMPLIFIER USING ENHANCEMENT-MODE FIELD EFFECT DEVICES

Filed Feb. 20, 1964 3 Sheets-Sheet 1

FRANK M. WANLASS
INVENTOR.

BY Roger S. Borovoy
ATTORNEY

FRANK M. WANLASS
INVENTOR.
BY Roger A. Bowery
ATTORNEY

FRANK M. WANLASS
INVENTOR.
BY Roger S. Borovoy
ATTORNEY

United States Patent Office 3,289,093
Patented Nov. 29, 1966

3,289,093

A.C. AMPLIFIER USING ENHANCEMENT-MODE FIELD EFFECT DEVICES

Frank M. Wanlass, Mountain View, Calif., assignor to Fairchild Camera and Instrument Corporation, Syosset, Long Island, N.Y., a corporation of Delaware Filed Feb. 20, 1964, Ser. No. 346,163
3 Claims. (Cl. 330—35)

The subject invention relates to an A.-C. amplifier employing an insulated-gate field-effect semiconductor device capable of operation in the enhancement mode. For easy reference, the insulated-gate field-effect semiconductor device will be referred to from here on as an "IFET," standing for "insulated-gate field-effect transistor." More particularly, the A.-C. amplifier of this invention uses an IFET connected in such a way that proper biasing will result during steady-state operation.

IFETs have now become generally accepted in the art. For example, an IFET is fully described in the proceedings of the IEEE, vol. 51, No. 9, page 1190–1202. Very briefly, the basic structure of an IFET consists of a substrate of semiconductor material, e.g., silicon, of one conductivity type, into which are diffused two adjacent islands of the opposite conductivity type. A silicon dioxide insulating layer overlays the area between the two diffused regions. A thin metal gate electrode is deposited on top of this silicon dioxide layer. One of the diffused islands is tied to the substrate to act as a source electrode; the other island acts as the drain electrode.

There are two types of IFETs. One is P-type (having an N-type substrate and P-type diffused islands); the other is N-type (having a P-type substrate and N-type diffused islands). The operation of a P-type IFET will be specifically described herein. It will be appreciated that the biasing can be reversed and an N-type IFET substituted for the P-type. The operation of a P-type IFET is based upon the fact that when its gate is biased negatively, electrons will tend to be repelled out of the N-type silicon body immediately beneath the gate. Holes will then be attracted to the gate region. If the gate is made sufficiently negative, the N-type silicon in the region close to the silicon oxide-silicon interface will be effectively converted to P-type material. An effective P-type linking region will then connect the diffused P-type source and drain islands and form a conductive path for current. The negative gate voltage at which such conduction between source and drain first occurs is called the gate threshold voltage, or $V_{gst}$. As the gate is made more and more negative beyond $V_{gst}$, the linking region connecting source and drain will progressively widen, resulting in lower and lower source-drain resistances.

An IFET has two important characteristics which make possible the amplifier of this invention. First, an IFET does not conduct any appreciable current unless its gate is biased with a voltage of the same polarity as its output. Second, the gate of an IFET is strictly voltage operated. Because of the capacitive connection between the gate and the body of the IFET, D.-C. current is never drawn through the gate. The mode of operation of a device where no current is conducted unless the gate is biased with the same polarity as the output is called the "enhancement mode." This mode of operation cannot be achieved with a conventional FET or vacuum tube, both of which require their inputs to be biased in the opposite polarity from their outputs.

The bias voltage of an IFET, $V_{ds}$ (the drain-source voltage), in the case of a P-type IFET, is always negative. Therefore, the drain PN junction is necessarily reverse-biased. When a gate voltage $V_{gs}$ more positive than $V_{gst}$ is applied, then the drain-source current $I_{ds}$ will be extremely small. The magnitude of such current is a silicon IFET, for example, is comparable to the current flowing in a reverse-biased silicon PN junction—less than about $10^{-9}$ amps. When $V_{gs}$ is made more negative than $V_{gst}$, the drain-source current increases. This increase may be considerable if $V_{gs}$ is made sufficiently negative. Typical devices exhibit a $V_{ds}$ (which equals $V_{gs}$) of $-11$ volts, and an $I_{ds}$ of $-5$ ma. For gate voltages more negative than $V_{gst}$, the characteristic curves of an IFET resemble those of a pentode because the dynamic output resistance is very high.

With the above description of the operation of an IFET, the amplifier of this invention may readily be understood. Briefly, the A.-C. amplifier comprises the following:

(a) an IFET capable of operation in the enhancement mode, such device having a gate, a drain, and a source;

(b) a means having a predetermined D.-C. impedance coupling the drain and gate of the IFET;

(c) a means for A.-C. coupling an input signal to the gate;

(d) a means for passing a current between the source and the drain of the IFET; and (e) a terminal coupled to the drain for coupling the amplified output signal of the amplifier to external circuitry.

Additional degrees of amplification may be obtained by cascading a plurality of the individual A.-C. amplifiers of this invention. Such a composite amplifier is made up of a plurality of IFETs, each capable of operation in the enhancement mode, and each having a gate, a source, a drain, and a load resistor connected in series with the drain. The free terminals of each of the load resistors are connected together, as are the sources of each of the plurality of IFETs. The IFETs are cascaded, the drain of one being coupled to the gate of the next. The gate of the first device serves as the input to the composite amplifier; the drain of the last device serves as the output. The composite amplifier is operated in exactly the same manner as the single IFET described above.

A preferred embodiment of the invention uses a deposited silicon resistor, made in accordance with the teachings of the invention.

The details of the single and composite A.-C. amplifiers of this invention, their method of operation, and their manufacture, including the formation of the deposited resistors, will be more fully understood from the following more complete description, making reference to the drawings, in which.

Figure 1:
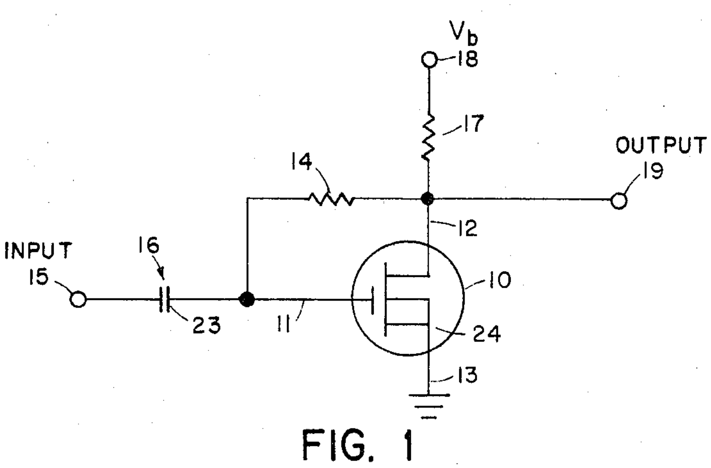
FIG. 1 is a schematic circuit diagram of an A.-C. amplifier of an embodiment of this invention.
Figure 2:
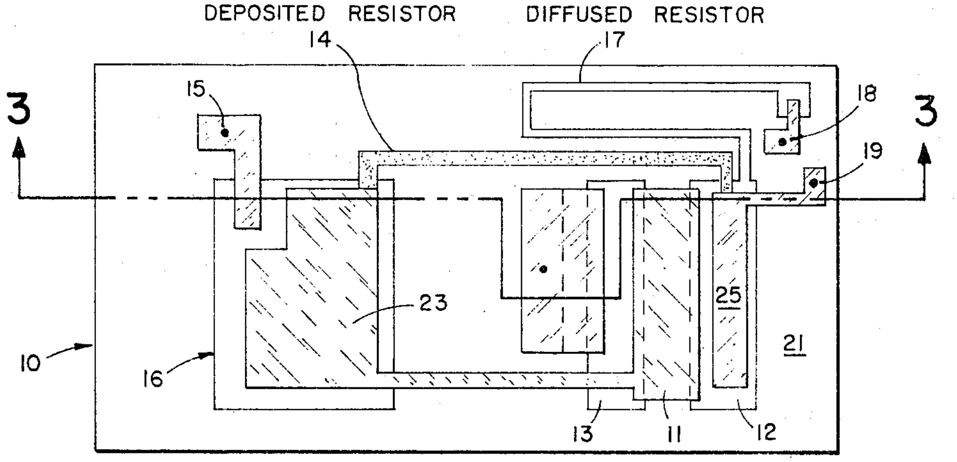
FIG. 2 is a plan view of the circuit of FIG. 1 integrated into a single semiconductor wafer, with the insulating layer not shown.
Figure 3:
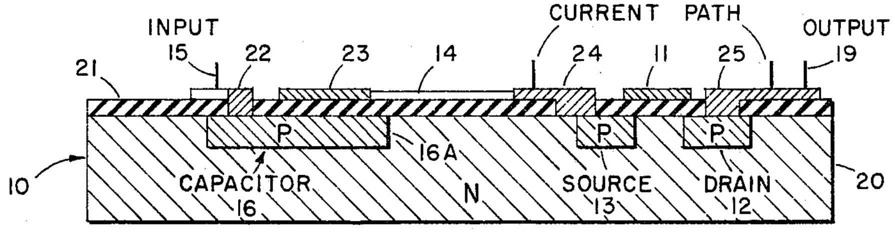
FIG. 3 is a cross-sectional view taken through the plane 3—3 of FIG. 2.

In the description which follows, FIGS. 1, 2, and 3 are referred to. The circuit shown in FIG. 1 is shown in its integrated form in a single semiconductor wafer in FIGS. 2 and 3. The circuit includes IFET 10 capable of operation in the enhancement mode. The IFET 10 has a gate 11, a drain 12, and a source 13. A means having a predetermined D.-C. impedance, for example resistor 14, is coupled between the drain and the gate of IFET 10, as shown. The amplifier of the invention has a means for A.-C. coupling an input signal to the gate. In the embodiment illustrated, this takes the form of input terminal 15. Preferably, the input signal is transmitted to gate 11 through an A.-C. coupling capacitor 16.

A means for passing a current between source and drain is included in the circuit. This means includes a load, such as resistor 17, in series with drain 12, and a means for passing current through that load. In the circuit of FIG. 1, the current-passing means takes the form of terminal 18 to which a voltage $V_B$ may be applied. The voltage supply supplying voltage $V_B$ (not shown), which is coupled to terminal 18, is coupled through load resistor 17 to drain 12. Source 13 is connected to a point of fixed voltage different from the voltage, $V_B$, of the voltage supply. The difference in voltage between terminal 18 and source 13 insures that a current $I_{ds}$ will flow between source and drain.

Finally, the amplifier includes an output means 19 coupled to drain 13, for coupling the output signal of the amplifier to external circuitry.

The fabrication of the device of FIGS. 2 and 3 can be accomplished by the use of conventional integrated circuit technology. A wafer 20 of semiconductor material, e.g., silicon, is uniformly doped with N-type impurities. This doping may be carried out during the growth of the semiconductor crystal, or thereafter if desired. P-type regions forming one plate 16*a* of capacitor 16, source 13, and drain 12 are then diffused into wafer 20. This diffusion is carried out using conventional masking techniques, preferably using the oxide of silicon as the mask. An oxide layer 21 is first formed on the surface of the wafer 20. Apertures are then etched in oxide layer 21 first for the diffusion of regions 12, 13, and 16*a*, and later in the oxide which reforms during the diffusion, for the formation of contacts to the various regions of the device. Oxide layer 21 is left on the surface of the wafer after the diffusions to protect the junctions of the device which extend to the surface of the wafer from subsequent contamination. The technology involved is fully described in U.S. Patent 3,025,589, assigfined to the same assignee as this invention.

Contact 22 penetrates oxide layer 21 through an aperture, making contact with P-type region 16*a*, which serves as one plate of the input coupling capacitor 16. The input terminal 15, which couples the input signal to the amplifier is connected to metal contact 22. Alternatively, contact 22 itself may be the input terminal. The other plate 23 of capacitor 16 is deposited on the surface of oxide layer 21. Oxide layer 21 itself serves as the dielectric of the capacitor 16.

Contact 24 is deposited through another aperture in oxide layer 21. Note that contact 24 makes contact both with source region 13 and with wafer 20. This contact is represented by terminal 24 in FIG. 1. Contact 24 serves as the contact for source 13 of the IFET. In the circuit of FIG. 1, source 13 is grounded.

Contact 25 pierces oxide layer 21 to make a connection to drain region 12. This contact serves as output terminal 19 of the amplifier circuit of FIG. 1. The metallizing for output terminal 19, along with the metallizing for gate 11, capacitor plate 23, input terminal 15, voltage supply terminal 18 and contacts 22 and 25 may be formed by depositing metal over the surface of the wafer and thereafter etching the unwanted portions away. The processing used is fully described in U.S. Patents 2,981,877 and 3,108,359, assigned to the same assignee as this invention.

Resistors 14 and 17 can be formed integrally in the single wafer of semiconductor material by various methods. In the particular embodiment illustrated, one resistor 14 was formed by one method and the other resistor 17 by another. Resistor 17 was diffused into the wafer, preferably at the same time as capacitor plate region 16*a* and drain and source regions 12 and 13. A very thin diffused region of the opposite conductivity type material from the wafer forms a path between drain 12 and contact 18 having a very high resistance. This resistance serves as resistor 17. Resistor 14 is deposited on the surface of oxide layer 21 on the wafer. The material of resistor 14 can be a conventional high resistance metal, such as nichrome.

Alternatively, a new type of resistor may be used, fabricated of semiconductor material, such as silicon. The method of forming thin film silicon resistors of this invention comprises the steps of:

(a) evaporating a thin layer of silicon onto an insulating substrate, and (b) removing portions of said layer to leave a resistive pattern having a high resistance between one portion thereof and another.

The evaporation may be carried out in an evaporator, preferably by applying an electron beam to the silicon source body to vaporize same. Depending upon the final resistance of the desired resistor, anywhere from about 50 to 20,000 A. of silicon may be evaporated. The evaporation is accomplished by placing the wafer in the evaporator and heating the wafer to about 300° C. This temperature is not critical, as satisfactory results may be obtained at other temperatures. In one particular embodiment, resistor 14 was prepared by evaporating silicon for 10 minutes with a wafer temperature of about 300° C. 1200 A. of silicon were evaporated. The pressure during the vacuum evaporation was about $2\times10^{-7}$ mm. Hg.

After the above evaporation, the silicon layer was etched using conventional photoetching techniques. In that way, the silicon was removed from the entire surface except where shown in FIG. 2 as resistor 14. The rectangular portion of resistor 14 was 13.5 x 3 mils. Its resistance was about $10^{11}$ ohms. To stabilize the value of this resistance, the wafer was heated for about 3 minutes at 550° C. to firmly bond the silicon resistor to the silicon oxide substrate. The above method provides a thin film resistor having a thin pattern of silicon deposited upon an insulating layer. The pattern has dimensions selected to provide a high resistance between one portion thereof and another. The obtainable and useful resistance range is from about $10^6$ to $10^{15}$ ohms. Such a resistor is very desirable for resistor 14 in this invention, which requires a high resistance.

Resistor 14 makes contact beneath the oxide layer 21 only with capacitor plate 23 and with drain contact 25. It is insulated by insulating oxide layer 21 from all other regions on wafer 20. Both resistors 14 and 17 can be made in the same way, or the method illustrated for resistor 14 could be used for resistor 17, or vice-versa.

Referring again to FIG. 1, the operation of the amplifier of this invention can be described. During steady-state conditions, where there is no input signal at terminal 15, the supply voltage $V_B$ applied to terminal 18 is chosen to be more negative by several volts than the gate threshhold voltage $V_{gst}$ of IFET 10. Therefore, no gate current flows in IFET 10 so that $V_{gs}$ (the voltage between gate 11 and source 13) equals $V_{ds}$ (the voltage between drain 12 and source 13). $V_{ds}$ is necessarily less than $V_B$. Otherwise, current would be conducted in the IFET causing a voltage drop in resistor 17. Moreover, $V_{ds}$ must not be as negative as $V_{gst}$. If it were, source-drain current would again flow. Therefore, with no input signal, $V_{ds}$ will automatically be biased to a value between $V_{gst}$ and $V_B$. In this bias region, the IFET has an appreciable small signal gain.

Figure 4:
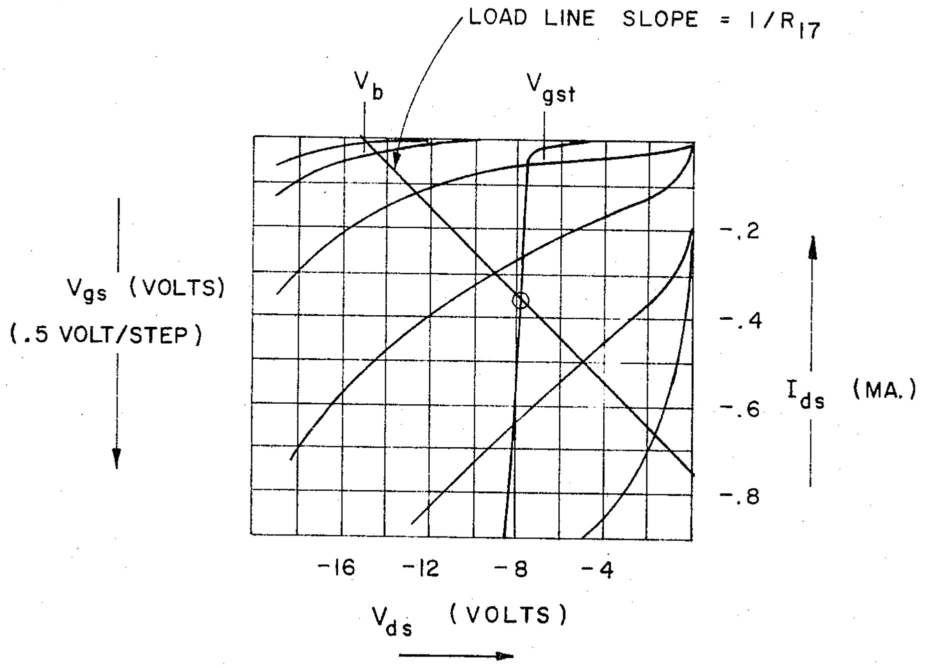
FIG. 4 is a graph showing the operation of the circuit of FIG. 1.

To find the exact small signal operating point for the circuit of FIG. 1, the graph of FIG. 4 is referred to. A plot is made of the drain-source current, $I_{ds}$, against the drain-source voltage ($V_{ds}$). Superimposed upon this line is the load line plotted with a slope of $1/R_{17}$, and with an abscissa intercept at $V_B$. The intersection of these two curves gives the operating point current $I_{dso}$ and the operating point voltage $V_{dso}$ (which is equal to $V_{gso}$). If the characteristic curves are now also superimposed on the same graph, as shown in FIG. 4, the variations in source-drain current and voltage, $\Delta i_{ds}$ and $\Delta v_{ds}$, due to small signal variations ($\Delta v_{gs}$) about $V_{gso}$ can be obtained. It is evident from the graph of FIG. 4 that the amplifier of FIG. 1 will automatically bias itself to a point of useful gain for almost any value of its load resistor $R_{17}$. The value of $R_{17}$ is therefore not particularly critical.

For determining static bias conditions, the values of $R_{14}$ and $C_{16}$ are unimportant. However, in order to have amplification of a small input signal fed to input terminal 15, the input coupling capacitor $C_{16}$ must be much larger than the gate-drain capacity $C_{gd}$ of the IFET. The reason for this is that a small change in the source-gate voltage ($\Delta v_{gs}$) will cause the drain voltage to change in the opposite direction. The size of the capacitor is very easy to satisfy. For a typical IFET, the gate-drain capacitance $C_{gd}$ is only about 0.2 picofarad (pf). Therefore, an input capacitor can easily be integrated in a semiconductor wafer, as was done in the device of FIGS. 2 and 3. It is possible to form integral capacitors having capacities greatly in excess of 0.2 pf.

Still another factor to be reckoned with in a device designed for small signal amplification is the degenerative effect of the signal coupling through resistor 14. This proportion of the signal coupled this way must be kept small in comparison to the signal coupled through capacitor 16 to gate 11. The degeneration of the signal through resistor 14 puts a limit upon the frequency response of the amplifier. A.-C. amplification can only be obtained down to a frequency $f_1$, which approximately equals $1/R_{14}C_{26}$. If, for example, the amplifier is desired to produce a flat frequency response down to about one cycle, the product of $R_{14}$ and $C_{16}$ should be at least several seconds. Since there is no D.-C. input current to gate 11, $R_{14}$ can be made extremely large in value and $C_{16}$ made fairly small in value to obtain a large $R_{14}C_{16}$ product. For example, a resistor $R_{14}$ of over $10^{12}$ ohms can be used. With such large resistors, however, it is important to select capacitor $C_{16}$ carefully, making sure it has a low leakage current. Otherwise, appreciable undesired leakage current could be drawn by the device.

Although it is known that large resistors are difficult to make in very close tolerances, the accuracy of the resistive value of resistor 14 is not important to the invention so long as the product $R_{14}C_{16}$ is much greater than the period of the lowest frequency signal to be amplified. Because of these loose tolerances, the extremely small size but large value thin film silicon resistors of this invention can be used very advantageously for resistor 14 in the amplifier of this invention.

Figure 5:
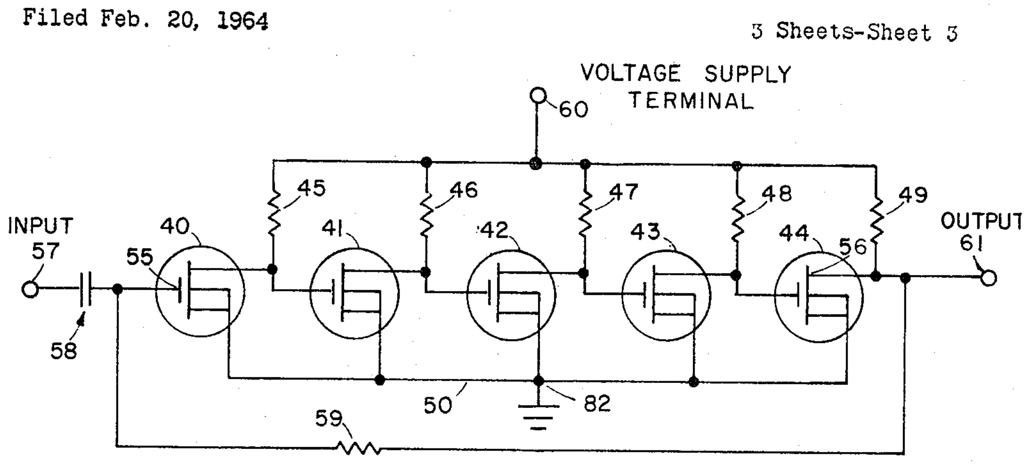
FIG. 5 is a compound amplifier circuit using a plurality of the individual amplifier circuits of FIG. 1.

Referring to FIG. 5, a circuit of another embodiment of this invention using a plurality of IFETs 40, 41, 42, 43, and 44 is shown. Each of the IFETs is capable of operation in the enhancement mode, and each has a gate, a source, and a drain. Load resistors 45, 46, 47, 48, and 49 are each connected in series with the drains of IFETs 40, 41, 42, 43, and 44, respectively. The free terminals of resistors 45, 46, 47, 48, and 49 are all connected together, as shown in FIG. 5. The sources of all five IFETs are common, being connected by lead 50. The five IFETs are cascaded, the drain of one being coupled to the gate of the next, as shown. Accordingly, lead 51 runs from the drain of IFET 40 to the gate of IFET 41; lead 52 runs from the drain of IFET 41 to the gate of IFET 42; lead 53 runs from the drain of IFET 42 to the gate of IFET 43; and lead 54 runs from the drain of IFET 43 to the gate of IFET 44. The five IFETs act as a cascaded amplifier with the gate 55 of the first (IFET 40) being the input, and the drain 56 of the last (IFET 44) being the output.

The cascaded amplifier has a means, such as input terminal 57, for A.-C. coupling an input signal to the gate 55 of the first IFET 40. Preferably, such coupling means includes a coupling capacitor 58. The amplifier of FIG. 5 has a means having a predetermined D.-C. impedance, for example, resistor 59 of high resistance, e.g., at least $10^6$ ohms, coupling gate 55 of the first IFET 40 with the drain 56 of the last IFET 44. Resistor 59 serves the same function in the circuit of FIG. 5 (that of providing a predetermined D.-C. impedance) as does resistor 14 in FIG. 1. Like the single amplifier of FIG. 1, the multiple amplifier of FIG. 5 has a means for passing current between the connected terminals of resistors 45–49 and the common sources connected by lead 50. Preferably, this means for passing a current includes a voltage supply coupled at terminal 60 to the connected resistors 45–49. To complete the circuit, the common sources on lead 50 are connected to a point of fixed voltage different from the voltage of the supply voltage at terminal 60, for example, ground potential. This voltage difference insures that current will pass between terminal 60 and lead 50.

Finally, the multiple amplifier has output means, such as terminal 61, coupling the drain 56 of the last IFET 44 to external circuitry to provide an output for the amplifier.

Figure 6:
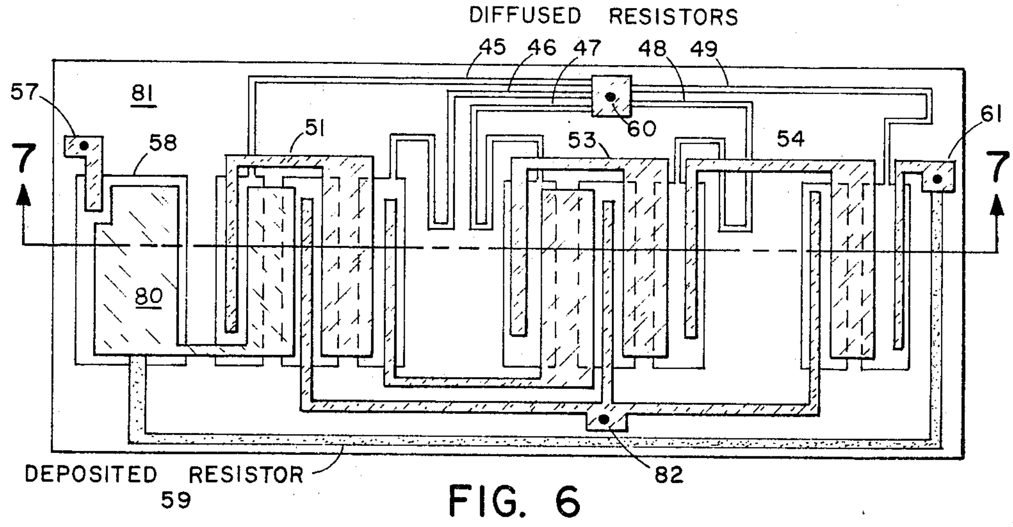
FIG. 6 is a plan view showing the circuit of FIG. 5 integrated into a single semiconductor wafer with the insulating layer not shown.
Figure 7:
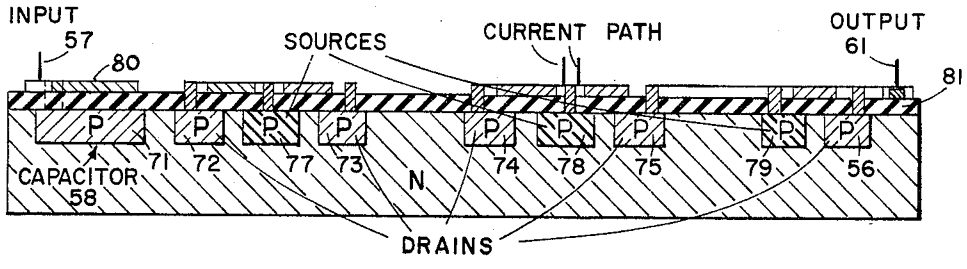
FIG. 7 is a cross-sectional view of the circuit of FIG. 6 taken through the plane 7—7.

The multiple amplifier of FIG. 5 may also be integrated on a single wafer of semiconductor material. An integrated device is shown in FIGS. 6 and 7. Referring to FIGS. 6 and 7, plate 71 of capacitor 58, drain regions 72, 73, 75, and 56, and source regions 77, 78, and 79 are all formed by diffusion in the same manner as described above for the single unit of FIGS. 2 and 3. Source 77 serves as a common source region for drains 72 and 73; similarly, source 78 serves as a common source region for drains 74 and 75. Source 79 serves only in conjunction with drain 56. Diffused resistors 45–49 are formed in the same manner as described above for resistor 17 in the single. Deposited resistor 59 is made according to the invention in the same way as resistor 14 described previously. Resistor 59 couples the plate 80 of capacitor 58 to drain 56 of IFET 44. Leads 51, 52, 53, and 54 are deposited on the surface of the wafer above oxide layer 81 as shown in FIG. 6. The voltage supply is connected to terminal 60; terminal 61 serves as the output. The input signal is applied at terminal 57. Terminal 82 is grounded, as shown in the circuit of FIG. 5.

The operation of the circuit of FIGS. 5, 6, and 7 is substantially the same as the circuit of FIG. 1. The principal difference is that five stages of amplification are afforded, instead of the single stage in the circuit of FIG. 1. The size of the finished device of FIGS. 6 and 7 is not appreciably larger than the size of the device of FIGS. 2 and 3. It must be remembered that a large number of diffused areas may be formed in a very small wafer of semiconductor material. Once finally encapsulated or packaged, the size of the chip or wafer of semiconductor material makes very little difference in the size of the finished product.

It will be appreciated by the skilled practitioner that the devices illustrated in the appended drawings are but a small representation of the many circuits and integrated embodiments of those circuits made possible using the general concepts of this invention. The geometries and particular devices selected for specific description are just a few of the possible choices. Therefore, the scope of the invention is not to be limited by the specific embodiments described above, but instead only as set forth in the claims which follow.

What is claimed is:

1. An A.-C. amplifier comprising:

a plurality of insulated-gate field-effect semiconductor devices capable of operation in the enhancement mode, each having a gate, a source, a drain, and a load resistor connected in series with its drain, the free terminals of each of said load resistors being connected together and the sources of said devices being common, said devices being cascaded, the drain of one being coupled to the gate of the next, said devices acting as a cascaded amplifier with the gate of the first being the input and the drain of the last being the output;

a fixed resistor directly coupling said gate of the first device and said drain of the last device;

means including an input terminal and a coupling capacitor for A.-C. coupling an input signal to said gate of said first device;

means for passing a current between said connected free resistor terminals and said common sources; and output means coupled to said drain of the last device for coupling the amplified output signal of the amplifier to external circuitry.

2. An A.-C. amplifier comprising:

a plurality of insulated-gate field-effect semiconductor devices capable of operation in the enhancement mode, each having a gate, a source, a drain, and a load resistor connected in series with its drain, the free terminals of each of said load resistors being connected together and the source of said devices being common, said devices being cascaded, the drain of one being coupled to the gate of the next, said devices acting as a cascaded amplifier with the gate of the first being the input and the drain of the last being the output;

a fixed resistor directly coupling said gate of the first device and said drain of the last device;

means for A.-C. coupling an input signal to said gate of said first device;

means for passing a current between said connected free resistor terminals and said common sources, said means for passing a current including a voltage supply coupled to said connected free resistor terminals, and a means connecting said common sources to a point of fixed voltage different from the voltage of said voltage supply; and output means coupled to said drain of the last device for coupling the amplified output signal of the amplifier to external circuitry.

3. An A.-C. amplifier comprising:

a plurality of insulated-gate field-effect semiconductor devices capable of operation in the enhancement mode, each having a gate, a source, a drain, and a load resistor connected in series with its drain, the free terminals of each of said load resistors being connected together and the sources of said devices being common, said devices being cascaded, the drain of one being coupled to the gate of the next, said devices acting as a cascaded amplifier with the gate of the first being the input and the drain of the last being the output;

a fixed resistor directly coupling said gate of the first device and said drain of the last device;

means including an input terminal and a coupling capacitor for A.-C. coupling an input signal to said gate of said first device;

means for passing a current between said connected free resistor terminals and said common sources, said means for passing a current including a voltage supply coupled to said connected free resistor terminals, and a means connecting said common sources to a point of fixed voltage different from the voltage of said voltage supply; and output means coupled to said drain of the last device for coupling the amplified output signal of the amplifier to external circuitry.

References Cited by the Examiner

UNITED STATES PATENTS

| | | | |
|---|---|---|---|
| 3,229,218 | 1/1966 | Sickles II et al. | |
| 3,233,122 | 2/1966 | Theriault. | |
| 3,233,186 | 2/1966 | Theriault | 330—19 |

OTHER REFERENCES

Field Effect Transistors (Theory and Applications Notes No. 2), June 1962, 8 pages, Amelco Semiconductor, Mt. View, Calif.

Bignell, How to Get Maximum Input Impedance with Field Effect-Transistors, pages 44–46, Electronics, March 8, 1963.

Hofstein et al., The Silicon Insulated-Gate Field-Effect Transistor, Proc. of IEEE, vol 51, No. 9, pages 1190–1202, Sept. 1963.

NATHAN KAUFMAN, *Primary Examiner.*

ROY LAKE, *Examiner.*

F. D. PARIS, *Assistant Examiner.*